United States Patent [19]

Helber, Jr.

[11] Patent Number: 5,186,379
[45] Date of Patent: Feb. 16, 1993

[54] INDIUM ALLOY COLD WELD BUMPS

[75] Inventor: Carlyle L. Helber, Jr., Fountain Valley, Calif.

[73] Assignee: Hughes Aircraft Company, Los Angeles, Calif.

[21] Appl. No.: 904,917

[22] Filed: Jun. 25, 1992

Related U.S. Application Data

[63] Continuation-in-part of Ser. No. 716,489, Jun. 17, 1991, abandoned.

[51] Int. Cl.$^5$ ............................................. H01L 21/98
[52] U.S. Cl. .................................... 228/116; 228/180.2
[58] Field of Search ............... 228/115, 116, 123, 180.2

[56] References Cited

U.S. PATENT DOCUMENTS

| | | | |
|---|---|---|---|
| 4,067,104 | 1/1978 | Tracy | 228/180.2 |
| 4,159,075 | 6/1979 | Ljung et al. | 228/116 |
| 4,431,711 | 2/1984 | Eisfeller | 428/31 |
| 4,740,700 | 4/1988 | Shaham et al. | 250/332 |
| 4,817,850 | 4/1989 | Wiener-Avnear | 228/180.2 |
| 4,865,245 | 9/1989 | Schulte et al. | 228/116 |
| 4,930,001 | 5/1990 | Williams | 156/634 |

*Primary Examiner*—Kenneth J. Ramsey
*Attorney, Agent, or Firm*—M. E. Lachman; M. W. Sales; W. K. Denson-Low

[57] ABSTRACT

An improved method for indium bonding of surfaces comprising forming indium bumps on a first surface, such as a semiconductor chip. An alloying metal which forms a primary-intermetallic-free alloy with indium is provided on a second surface, such as a substrate to be connected to the pad of the semiconductor chip. The pad and substrate are cold welded at 2000 to 6000 pounds per square inch ($1.0 \times 10^5$ to $3.1 \times 10^5$ mm Hg) to form indium alloy bonds having improved strength, reliability, and toughness.

15 Claims, No Drawings

INDIUM ALLOY COLD WELD BUMPS

This application is a continuation-in-part of copending application Ser. No. 716,489, filed Jun. 17, 1991, now abandoned.

BACKGROUND OF THE INVENTION

1. Field of the Invention

The present invention relates to a method for connecting a semiconductor chip to a substrate. In particular, the method involves cold welding of indium bumps to an indium alloyable metal. The invention further relates to a device formed by the method of the present invention.

2. Description of Related Art

Cold weldable indium bumps are used to interconnect semiconductor chips to a substrate. The connection process is typically used for detector multiplex array electrical connections of integrated circuits, for semiconductor chips, such as flip chips, and for other products. Prior art bump and pad arrangements have been in use since the 1960's. These include the well-known solder-to-solder bump contact, the indium-to-indium bump contact, and the gold-to-gold contact. Each of these contacts is processed by means of a reflow procedure, and the bump and pad structures may be welded together in any conventional welding manner. The trend in electronics is towards high frequency circuits and increasing use of flip chips (i.e., chips with tabs on the bottom that require bottom connections). This is because flip chips, as compared to tape automated bonding (TAB) or wire bond chips, can reliably accommodate smaller connections which permit higher pad packing densities. Also, flip chips can be more densely packed in the available cross-sectional area on a substrate.

Typically, flip chips have interconnection pads only at the chip periphery, which might require only 256 bonds. Other types of flip chip sensors have over 16,000 indium bonds per chip in a "checkerboard" pattern. The failure or 10 intermittency of just a few interconnections can lead to scrap/rework of very expensive chips. Low yields have been reported for the indium-to-indium cold weld process. This is an especially critical problem because of the extensive use of flip chips.

Previously, flip chips were either lead-tin solder melt interconnected (soldering) or indium-to-indium cold welded. Both of these processes have limitations, as discussed below.

In soldering, the solder and the substrate and/or flip chip must be precisely aligned so that the solder on one part intimately faces the solder on the other part. For a connection involving 256 pads, for example, the solder on each of the 256 pads must be touching or in close proximity to the mating surface. This condition needs to be maintained during thermal exposure so that the solder on each pad not only melts but cross-wets the opposing solder to form a structurally sound bond with only the corresponding opposite mating surface. In addition, solder mass and degree of gap at the interface for all 256 pads must be carefully maintained within close tolerances since extrusion or splattering of melted solder or excessive bulging could cause electrical shorting of adjacent pads.

Other problems with soldering include the required high temperatures which can degrade some semiconductor chips. This can be further aggravated by subsequent solder melting that is many times required when removal and rework prove necessary. This thermal removal problem is made even more difficult if there are other chips in the local vicinity that might be affected during the heat exposure. Thus, the ability to rework the chip can be limited.

In cold weld indium interconnection, the method requires indium bumps on the chip and the substrate to be of precise mass, geometry, and height. The chip and substrate are precision aligned so that all indium bumps can be brought into pressing contact. The chip and substrate are pressed together at sufficiently high pressure to cause fusion of the indium bumps on the opposing surfaces. Bonding is essentially done at room temperature as melting of the indium is not required.

The resulting cold weld indium bump joint serves the dual function of being an electrical connection while also achieving mechanical attachment of the chip to the substrate. This mechanical attachment has a tensile strength at the contact interface of less than 400 pounds per square inch (psi), or $2.07 \times 10^4$ millimeters of mercury, which represents a relatively weak bond strength across the cross-sectional contact interface. These relatively weak connections give an acceptable yield when the thermal expansion is about the same for the chip and substrate. However, when there is a thermal expansion mismatch, bond failure does occur at the indium-to-indium contact interface during thermal cycle testing of the device, and low yields have been experienced. The net effect, when coupled with variations in indium bump mass, geometry and height control, planarity, registration alignment and differential material thermal expansion, has resulted in low process yields.

Although indium-to-indium bonding can be achieved in a room temperature process, bond strength is quite limited. Improvements in bond strength have been achieved by cold bonding of indium to gold, as disclosed in U.S. Pat. No. 4,930,001, assigned to the present assignee. While very useful for its intended purpose, this indium-to-gold alloy bond has certain thermal limitations, which cause bond failure. More specifically, in an indium-to-gold alloy bond, the alloy consists of a new phase or phases where there is a chemical bond between the indium and gold which is stronger than either metal alone. However, over a long period of time solid state diffusion or thermal cycling of these bonds results in the formation of relatively thick primary and secondary intermetallic phases which weaken the bond. Consequently, indium-to-gold alloy bonds are initially strong, but with the passage of time and/or thermal cycling, these bonds become weakened, even to the point of failure. The term "primary intermetallic phase" is used herein to mean a compound of the two or more single phase metals or metal alloys forming the bond, which is a separate phase and of a single composition. The term "secondary intermetallic phase" is used herein to mean a compound of the two or more single phase metals or metal alloys forming the bond, which is a separate phase and of varying composition. Other metals which form primary intermetallic phases when alloyed to indium include antimony, arsenic, bismuth, copper, magnesium, manganese, nickel, silver, and thallium.

Accordingly, there an on-going need to develop improvements in the alloying system to which indium bumps are bonded. It would be advantageous in the formation of indium cold weld bonds if alloying metals were available for creating more metallurgically sound bonds than indium-indium or indium-gold bonds. The low yields seen in the indium-to-indium cold weld process considerably increase the cost of production. It would be desirable to have a process with increased yield at lower cost. It would be further desirable to have a process highly applicable to a flip chip product that created strong and reliable indium cold welded bump electrical connections between the pads on the semiconductor chip and substrate. It would be further desirable if such a connecting process created a less thermally-sensitive connection and still resulted in a strong and reliable cold welding connection of semiconductor chips to their substrate.

SUMMARY OF THE INVENTION

In accordance with the present invention, it was discovered that indium can be cold weld bonded with an alloying metal that forms an alloy with indium when cold welded wherein said alloy is substantially free of a primary intermetallic phase, to provide interconnections to semiconductor chips wherein the bonds have improved strength, reliability, and toughness. The indium cold weld alloy bonds of the present invention overcome the above-mentioned disadvantages of the prior art and provide indium alloy bonds having greater fatigue resistance and endurance than the interconnections created by prior indium-to-indium cold welds and indium-to-gold alloy contacts.

In accordance with the present invention, a method is provided for indium bonding of surfaces which comprises the steps of providing an indium bump on a first surface, which is typically a pad on a semiconductor chip. An alloying metal which forms a primary-intermetallic-free alloy with indium is provided on a second surface, which is typically a substrate to be connected to the pad of the semiconductor chip. The first surface and the second surface are juxtaposed, that is, precisely aligned. The outer surface of the indium bump on the first surface is pressed against the alloying metal located on the second surface at a pressure within the range of about 2000 to 6000 psi at a temperature within the range of about 20° to 150° C. for a sufficient period of time to form a primary-intermetallic-free alloy of the indium and the alloying metal to thereby bond the indium bump to the second surface.

The invention further involves a device comprised of a semiconductor chip and a substrate connected to the semiconductor chip which are connected by the above-described method.

DETAILED DESCRIPTION OF THE INVENTION

In general terms, the method of the present invention for indium bonding of surfaces begins with the step of providing an indium bump on a first surface. A second surface is provided having an alloying metal disposed thereon. The outer surface of the indium bump located on the first surface is pressed against the alloying metal located on the second surface, and the first surface and the second surface are fused in a primary-intermetallic free alloy bond, that is, cold welded to each other to form an indium alloy bond. Further, according to the invention, a device formed by the above-described method is provided.

Considering the method of the invention in more detail, an indium bump is provided on a first surface, which is typically a pad on a semiconductor chip. The indium bumps are formed by methods known in the art, such as described, for example, in U.S. Pat. No. 4,930,001, incorporated herein by reference. Vapor deposition of indium may be performed by well-known techniques of sputtering ion plating, or electro-deposition.

In a further step, an alloying metal is deposited on the second surface, the second surface being the substrate. Substrates which can be used in the present invention include, but are not limited to, ceramics such as alumina or beryllia, or semiconductors, such as germanium or silicon. If differential thermal expansion is not of concern, the substrate may be standard printed wiring board materials, such as metal clad Kapton ® (a trademark of DuPont), polyimide/glass laminates, or epoxy/glass laminates.

The alloying metal deposited on the second surface, according to the present invention, forms a primary-intermetallic-free alloy with indium to provide a substantially durable cold weld electrical connection. A mating surface comprised of the alloying metal deposited on the second surface is deposited as a plurality of bumps, or as a smooth plane. The mating surface of the alloying metal is that surface which is fused in the method of the present invention with the mating surface formed by the outer surfaces of the indium bumps located on the first surface. Whether deposited as a plurality of bumps or as a smooth plane, the mating surface alloying metal on the second surface is disposed parallel to the plane formed by the tops of the indium bumps deposited on the first surface. Alternatively, the second surface itself may be comprised of an alloying metal and may be directly bonded to the indium bumps on the first surface.

The method of the present invention juxtaposes, that is, precisely aligns, the mating surfaces of the indium bumps on the first surface with the mating surfaces of the alloying metal bumps formed on the second surface. The opposing bumps located on the first and second surfaces are pressed for a sufficient time, pressure, and temperature to fuse to provide alloy bonding of the indium bumps to the alloying metal disposed as bumps or as a plane on the second surface. The invention employs known techniques of precision alignment to precisely align and bring into pressing contact the indium bumps on the first surface with the alloying bumps on the second surface. Typical precision alignment techniques useful in the present invention are visual/mechanical and infrared "see through" visual alignment devices. The invention further employs well-known techniques for cold welding, with the following changes. In accordance with the present invention, the pressure applied during cold welding is about 2000 to 6000 pounds per square inch (psi) or $1.0 \times ^5$ to $3.1 \times 10^5$ mm of mercury. This increased pressure as compared to known methods has been found to produce welded bonds of increased strength and durability due to the formation of alloys that are substantially free of primary intermetallic phases. In the present process, this pressure can be applied at a temperature as low as room temperature, for a period of time as short as 5 seconds, as discussed in further detail below.

The alloying metal deposited on the second surface is selected to be a metal or combination of metals which is capable of forming an alloy with indium when cold welded wherein the alloy is substantially free of a primary intermetallic phase (referred to herein as "primary-intermetallic-free"). These primary-intermetallic-free alloys are strong when formed and remain strong and tough with the passage of time and upon thermal exposure. Consequently, bonds formed of these primary-intermetallic-free alloys are durable and provide improved electrical connections. The alloying metal must, of course, be compatible with the substrate material and the diffusion environment to which the final device is exposed. The alloying metal may be an element such as aluminum, cadmium, gallium, germanium, silicon, or zinc. The alloying metal may optionally be indium alloyed to any one or more of the aforementioned elements, such as indium/aluminum, indium/cadmium, indium/zinc or indium/zinc/aluminum alloys. In addition, certain metals or metal mixtures form only secondary intermetallic phases with indium that are free from and do not have the same negative effect as the primary intermetallic phases. Such metals include lead, lithium, thallium, tin, or tin/lead. These latter metals and metal mixtures may alternatively be used in practicing the present invention. The alloying metal may optionally be a metal alloyed with one or more metals other than indium, such as aluminum/cadmium, aluminum/zinc, cadmium/zinc, lithium/aluminum, sodium/aluminum, and potassium/aluminum. The term "alloying metal" as used herein is intended to include all of these various metals and combinations thereof, as well as the multiple-layer structure described below.

According to the present invention, the choice of an exemplary alloying metal for deposition on the second surface depends on the thermal environment in which the final device, which is formed by the method of the invention, operates. A suitable alloying metal for the second surface is selected on the basis of its thermal expansion properties in relation to the thermal environment where the device will operate. For example, the invention contemplates using an alloying metal with a higher tensile strength for forming cold welded bump electrical connections in semiconductor chips to be used at higher temperatures. Such metals are typically thallium or lead. For semiconductors to be used below room-temperature, the invention contemplates using an alloying metal with toughness in a thermal expansion environment but having less tensile strength than the alloying metals typically used at higher temperatures. These alloying metals for use at lower temperatures are typically aluminum, zinc/aluminum, tin/aluminum, lithium/aluminum, sodium/aluminum, potassium/aluminum, lead, tin, tin/lead, zinc, gallium, cadmium and metallic element coated aluminum, such as zincated aluminum and stannated aluminum.

As is known in the art, it is difficult to cold weld directly to aluminum due to the strongly adherent oxide on the aluminum surface. In accordance with one embodiment of the present invention, this problem is overcome by providing the aluminum surface immediately after formation with a thin adherent coating of a chosen metal which prevents or controls oxide formation on the aluminum surface. The chosen metal must be compatible with the present cold weld method; i.e., not interfere with bond formation, and must exhibit only slight surface oxidation. Preferred chosen metals for this coating include zinc, lead, cadmium, or tin. The coating may comprise a single layer or multiple layers of different materials, such as in a cadmium or lead displaced zincated aluminum structure. The coating is formed by known vacuum deposition or immersion displacement methods.

In accordance with the present invention, indium is deposited on the first surface and an alloying metal is deposited on the second surface. Then, the first surface is juxtaposed to the second surface. This juxtaposition disposes the first and second surfaces sufficiently close for the first surface to be cold welded to the second surface at a temperature from room temperature to just below the melting point of the lowest melting point metal, usually indium (at 150° C.). Typical time periods for cold welding are from about 5 seconds to about 300 seconds (or 5 minutes). Typical pressures for cold welding are from about 2000 psi or about $1.0 \times 10^5$ mm Hg to about 6000 psi or about $3.1 \times 10^5$ mm Hg.

Alternatively, after cold welding, the structure so formed may be additionally heated at a temperature within the range of about 25° C. to just below 150° C. for up to 120 hours to evenly distribute the alloy cold weld product throughout the indium, resulting in stronger and tougher bonds. This added treatment is especially useful for solid solution alloys, such as the binary systems of indium/cadmium and indium/zinc and the ternary system of indium/zinc/aluminum. Optionally, this heating step may be performed in an inert atmosphere, such as nitrogen, argon, helium or hydrogen, to avoid the formation of oxidation products.

The present invention also provides a device formed by the abovedescribed method. The device comprises a semiconductor chip and a substrate connected to the semiconductor chip. The method of connecting the semiconductor chip to the substrate involves depositing indium bumps on the first surface, depositing an alloying metal on the second surface, juxtaposing the first surface to the second surface, and cold welding the first surface to the second surface by the above-described method. Typical devices formed by the method of the invention are planar sensor arrays or flip chips.

The following example is offered by way of illustration and is not intended to limit the invention in any manner.

EXAMPLE 1

In accordance with the present invention, a number of metals were evaluated for their ability to alloy bond with indium under cold welding conditions.

In a diffraction grating pattern, 50-micron wide lines on 100-micron spacing were deposited by electroplating, using known methods. These samples had 100 trace lines. For the matching samples an alloying metal was similarly deposited so that the sample had 100 traces, 50-micron wide at 100-micron spacing. The alloying metals tested were zinc, cadmium, lead, lead/tin, tin, and adherent thin coatings of zinc, lead or cadmium on aluminum.

The metal traces of indium and of the alloying metal were placed in contact at 90 degrees to form the letter "X". A load of 6000 psi ($3.1 \times 10^5$ mm Hg) was applied for 5 minutes at 20° C.

Some samples were pulled apart immediately. Others were heated at 150° C. for up to 120 hours and then pulled apart.

All samples were examined by scanning microscopy. Fractography results indicated that a ductile failure occurred with tensile strength up to one magnitude stronger than indium-to-indium cold welds, which are known to be about 400 psi ($2.07 \times 10^4$ mm of mercury). The electroplated indium, as deposited, failed cohesively within itself, indicating that the cold weld bond was stronger than the indium itself. The sample comprising lead/tin as the alloying metal exhibited excellent interfacial adhesion as evidenced by "taffy" like fractography. The samples comprising aluminum with a coating also exhibited excellent interfacial adhesion.

Additional tests were performed in which indium bumps were cold weld bonded in accordance with the present method to a lead plated printed wiring board and to a cadmium plated printed wiring board. In both cases, excellent interfacial indium adhesion was evidenced by ductible "taffy" like fractography.

It is apparent that many modifications and variations of this invention, as set forth above, may be made without departing from the scope of the present invention. The specific embodiments described are given by way of example only, and the invention is limited only by the appended claims.

What is claimed is:

1. A method for indium bonding of surfaces comprising the steps of:
   (a) providing an indium bump on a first surface;
   (b) providing a second surface having an alloying metal located thereon wherein said alloying metal is capable of forming an alloy with indium when cold welded wherein said alloy is substantially free of a primary intermetallic phase; and
   (c) pressing said indium bump located on said first surface against said alloying metal located on said second surface at a pressure within the range of about 2000 to 6000 psi ($1.0 \times 10^5$ to $3.1 \times 10^5$ mm Hg) at a temperature within the range of about 20° C. to 150° C. for a sufficient period of time to form said alloy of said indium and said alloying metal to thereby bond said indium bump to said second surface to provide a substantially durable cold weld electrical connection having a bond interface which is substantially free of primary intermetallic phase.

2. The method of Claim 1 wherein said alloying metal is selected from the group consisting of elemental metals, metal alloys, and metal mixtures.

3. The method of Claim 2 wherein said elemental metal is selected from the group consisting of aluminum, cadmium, gallium, germanium, silicon, and zinc.

4. The method of Claim 2 wherein said alloying metal comprises indium bonded to a metal selected from the group consisting of said elemental metals.

5. The method of Claim 2 wherein said alloying metal comprises one or more metals bonded to a metal other than indium.

6. The method of Claim 1 wherein said alloying metal forms a secondary intermetallic phase with said indium which is substantially free of said primary intermetallic phase.

7. The method of Claim 1 wherein said alloying metal has the property of forming an unwanted surface oxide layer and said method further comprises, prior to said pressing, providing said alloying metal with a thin adherent coating of a chosen metal to control the formation of said surface oxide and to thereby enable the formation of said alloy of said indium and said alloying metal.

8. The method of Claim 7 wherein said chosen metal is selected from the group consisting of zinc, lead, cadmium, and tin.

9. The method of Claim 1 further comprising, after said pressing, heating to a temperature within the range of about 25° C. to 150° C. for about 1 to 120 hours to enhance the formation of said alloy of said indium and said alloying metal.

10. The method of Claim 1 wherein said first surface comprises a pad on a semiconductor chip.

11. The method of Claim 1 wherein said second surface is a substrate wherein said substrate has a bonding pad.

12. The method of Claim 1 wherein said alloying metal on said second surface is in the form of a bump on said second surface.

13. The method of Claim 1 wherein said alloying metal on said second surface is in the form of a smooth plane on said second surface, said smooth plane being parallel to a plane formed by said deposited indium on said first surface when said second surface is juxtaposed to said first surface.

14. The method of Claim 1 wherein said second surface comprises said alloying metal.

15. A device formed by the method of Claim 1 comprising a semiconductor chip connected to a substrate.

* * * * *